US008635582B2

(12) United States Patent
Stellari et al.

(10) Patent No.: US 8,635,582 B2
(45) Date of Patent: Jan. 21, 2014

(54) NAVIGATING ANALYTICAL TOOLS USING LAYOUT SOFTWARE

(75) Inventors: Franco Stellari, Waldwick, NJ (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,776

(22) Filed: Sep. 12, 2012

(65) Prior Publication Data

US 2013/0061199 A1    Mar. 7, 2013

Related U.S. Application Data (62) Division of application No. 12/692,198, filed on Jan. 22, 2010, now Pat. No. 8,312,413.

(51) Int. Cl.
G06F 17/50 (2006.01)
G06F 9/44 (2006.01)
G09G 5/00 (2006.01)

(52) U.S. Cl.
USPC ............... 716/139; 716/50; 716/51; 716/52; 716/53; 716/54; 716/55; 717/100; 717/114; 717/120; 717/125; 717/135; 345/619

(58) Field of Classification Search
USPC .............. 716/100, 139, 50–55, 110; 717/100, 717/114, 120, 125, 135; 345/619
See application file for complete search history.

(56) References Cited

U.S. PATENT DOCUMENTS

| 4,839,588 A | 6/1989 | Jantsch et al. |
| 5,526,517 A | 6/1996 | Jones et al. ............ 707/999.008 |
| 6,185,707 B1 | 2/2001 | Smith et al. |
| 6,442,720 B1 | 8/2002 | Koprowski et al. |

(Continued)

FOREIGN PATENT DOCUMENTS

| EP | 0 510 887 A2 | 10/1992 |
| EP | 0 510 887 B1 | 10/1992 |

(Continued)

OTHER PUBLICATIONS

Knebel et al., Diagnosis and Characterization of Timing-Related Defects by Time-Dependent Light Emission, http://www2.computer.org/portal/web/csdl/doi/10.1109/TEST.1998.743254.

(Continued)

*Primary Examiner* — Stacy Whitmore
(74) *Attorney, Agent, or Firm* — Anne V. Dougherty; Ryan, Mason & Lewis, LLP (57) ABSTRACT

A background process installs a system hook for message interception of integrated circuit chip layout display software. A call message is intercepted through the system hook, and current layout coordinates are read from the integrated circuit chip layout display software. A representation of the current layout coordinates is entered into tool control software configured to control a physical tool for analyzing integrated circuits, and the physical tool is controlled with the tool control software. In an "inverse" approach, a background process is used to install at least one system hook for message interception of tool control software configured to control a physical tool for analyzing integrated circuits, and a call message is intercepted through the system hook. Current coordinates are read from the tool control software. A representation of the current coordinates is entered into integrated circuit chip layout display software, and at least a portion of an integrated circuit layout is displayed.

11 Claims, 8 Drawing Sheets

(56) References Cited

U.S. PATENT DOCUMENTS

| | | |
|---|---|---|
| 6,510,543 B1 | 1/2003 | Gu et al. ............... 716/118 |
| 6,553,646 B1 | 4/2003 | de Rochemont |
| 6,684,379 B2 | 1/2004 | Skoll et al. ............... 716/102 |
| 6,721,935 B2 | 4/2004 | Morinaga |
| 6,775,796 B2 | 8/2004 | Finkler et al. |
| 6,799,130 B2 | 9/2004 | Okabe et al. |
| 6,886,148 B2 | 4/2005 | Solomon ............... 716/139 |
| RE38,900 E | 11/2005 | Rostoker et al. ............ 438/14 |
| 6,995,564 B1 | 2/2006 | Ang et al. |
| 7,016,755 B2 | 3/2006 | Abuku ............... 700/121 |
| 7,020,582 B1 | 3/2006 | Dicosola et al. |
| 7,089,513 B2 | 8/2006 | Bard et al. |
| 7,113,630 B2 | 9/2006 | Dajee et al. |
| 7,224,828 B2 | 5/2007 | Cotton et al. |
| 7,320,115 B2 | 1/2008 | Kuo |
| 7,343,583 B2 | 3/2008 | Keck et al. ............... 716/51 |
| 7,400,154 B2 | 7/2008 | Desplats et al. |
| 7,457,736 B2 | 11/2008 | Chang ............... 703/13 |
| 7,676,348 B2 | 3/2010 | Okada ............... 703/2 |
| 7,747,975 B2 | 6/2010 | Dinter et al. ............... 716/119 |
| 7,752,594 B2 | 7/2010 | Takeda et al. ............... 716/51 |
| 2002/0101436 A1 | 8/2002 | Shastri et al. ............... 345/619 |
| 2005/0193361 A1* | 9/2005 | Vitanov et al. ............... 716/19 |
| 2006/0147812 A1* | 7/2006 | Ho et al. ............... 430/5 |
| 2006/0171221 A1 | 8/2006 | Mollat et al. |
| 2007/0022402 A1* | 1/2007 | Ye et al. ............... 716/21 |
| 2007/0050749 A1* | 3/2007 | Ye et al. ............... 716/20 |
| 2007/0089080 A1* | 4/2007 | Sakuraba ............... 716/11 |
| 2007/0094635 A1* | 4/2007 | Suh et al. ............... 716/21 |
| 2008/0024794 A1 | 1/2008 | Miyazaki et al. |
| 2008/0295048 A1* | 11/2008 | Nehmadi et al. ............... 716/4 |
| 2009/0106714 A1 | 4/2009 | Culp et al. |
| 2009/0241075 A1* | 9/2009 | Ahmed et al. ............... 716/4 |
| 2010/0058268 A1* | 3/2010 | Fein et al. ............... 716/10 |
| 2011/0131544 A1* | 6/2011 | Majumder et al. ............... 716/139 |
| 2011/0173589 A1* | 7/2011 | Guttman et al. ............... 717/125 |

FOREIGN PATENT DOCUMENTS

| | | |
|---|---|---|
| JP | 2001201545 | 7/2001 |
| JP | 2001203248 | 7/2001 |
| JP | 2008198913 | 8/2008 |

OTHER PUBLICATIONS

Stellari et al., U.S. Appl. No. 12/493,686, filed Jun. 29, 2009, titled Creating Emission Images of Integrated Circuits.

Boit et al., Physical Techniques for Chip-Backside IC Debug in Nanotechnologies, Silicon Debug and Diagnosis, 2008 IEEE, pp. 250-257.

Image Processing—Image and Video Processing, Analysis, Algorithm Development, and System Design, The MathWorks, http://www.mathworks.com/applications/imageprocessing/, 2009.

Hamamatsu, Inverted Emission Microscope iPHEMOS-SD, www.hamamatsu.com, pp. 1-2, 2008.

Math Software for Engineers, Educators & Students, Maplesoft, http://www.maplesoft.com, 2009.

Wolfram Mathematica7, http://www.wolfram.com/products/mathematica/index.html, 2009.

DCG Systems, Meridian, Spatial Fault and Defect Localization, http://www.dcgsystems.com/meridian-IV.html, pp. 1-4, 2009.

BSIM—Wikipedia, http://en.wikipedia.org/wiki/BSIM, 2009.

SPICE—Wikipedia, http://en.wikipedia.org/wiki/SPICE, pp. 1-5, 2009.

AutoIt v3—Automate and Script Windows Tasks—For Free! http://www.autoitscript.com/autoit3/index.shtml, Jan. 21, 2011.

* cited by examiner

NAVIGATING ANALYTICAL TOOLS USING LAYOUT SOFTWARE

CROSS-REFERENCE TO RELATED APPLICATIONS

This application is a divisional of U.S. patent application Ser. No. 12/692,198, filed Jan. 22, 2010, incorporated by reference herein.

FIELD OF THE INVENTION

The present invention relates to the electrical, electronic and computer arts, and, more particularly, to analysis and test of integrated circuits (ICs) and the like.

BACKGROUND OF THE INVENTION

The development and fabrication of advanced integrated circuits typically employs layout software, which displays the layout of the chip. Non-limiting examples include packages available from Mentor Graphics, Wilsonville, Oreg., USA; XYALIS, Grenoble, France; and Cadence Design Systems, Inc., San Jose, Calif., USA. Test, diagnostics, and failure analysis of ICs may employ various analytical tools. Non-limiting examples include emission-based techniques, laser voltage probes, laser stimulation tools, focused ion beams (FIB), and the like.

U.S. Pat. No. 6,185,707 of Smith et al. discloses an IC test software system for mapping logical functional test data of logic integrated circuits to a physical representation. The system of the Smith et al. patent determines and displays the X, Y location corresponding to a net name, by translating functional test data of a digital logic chip passed through a simulation model which identifies one or more defective nets of the chip. The defective nets are processed against a database to obtain X, Y coordinate data for these nets, allowing them to be data logged as physical traces on the chip layout.

SUMMARY OF THE INVENTION

Principles of the invention provide techniques for navigating analytical tools using layout software. In one aspect, an exemplary method includes the steps of using a background process to install at least one system hook for message interception of integrated circuit chip layout display software; intercepting a call message through the system hook; and, responsive to the call message, reading current layout coordinates from the integrated circuit chip layout display software. The method further includes entering a representation of the current layout coordinates into tool control software configured to control a physical tool for analyzing integrated circuits; and controlling the physical tool for analyzing integrated circuits with the tool control software, based on the representation of the current layout coordinates.

In another aspect, another exemplary method includes the steps of using a background process to install at least one system hook for message interception of tool control software configured to control a physical tool for analyzing integrated circuits; intercepting a call message through the system hook; and, responsive to the call message, reading current coordinates from the tool control software. The method further includes entering a representation of the current coordinates into integrated circuit chip layout display software; and displaying at least a portion of an integrated circuit layout corresponding to the representation of the current coordinates from the tool control software.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed.

One or more embodiments of the invention or elements thereof can be implemented in the form of a computer product including a computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

One or more embodiments of the invention may offer one or more of the following technical benefits:

- Automate tedious user processes
- Reduce human errors that may occur when layout coordinates are manually converted and input to the analytical tool
- Increase the speed by which layout coordinates may be transferred to the analytical tool
- Implement coordinates transformations (rotation, translation, inversions, scaling) for analytical tools that do not handle such transformations
- Does not require special handling or parsing of the layout into a format that the analytical tool can import (this may be a very difficult, and at the very least, time consuming process)

These and other features, aspects and advantages of the invention will become apparent from the following detailed description of illustrative embodiments thereof, which is to be read in connection with the accompanying drawings.

DETAILED DESCRIPTION OF PREFERRED EMBODIMENTS

Performing test, diagnostics, and failure analysis of modern ICs can be accomplished by driving analytical tools, using chip layout information, so that the appropriate locations may be probed, imaged, modified, and so on. An exemplary list of such tools includes, but is not limited to:

Time Resolved Emission (TRE) tools such as the Emiscope® II and III platforms from DCG Systems Inc. of Fremont, Calif., USA and the TriPHEMOS® tool from Hamamatsu Photonics K.K., Hamamatsu City 430-8587, Japan;

Static emission tools such as the MERIDIAN system from DCG Systems and the Phemos® microscope family from Hamamatsu;

Laser Voltage Probes, such as the RUBY system from DCG Systems;

Laser Stimulation tools from many vendors including DCG Systems, Hamamatsu, Quantum Focus Instruments Corporation, Vista, Calif., USA, and so on;

Focused Ion Beams (FIB) tools from many vendors

In some embodiments, a suitable commercially available emission tool can be used to acquire images from chips; this tool may be able to acquire time-integrated (static) emission or time-resolved (dynamic) emission. Examples of time resolved tools similar to one described in U.S. Pat. No. 7,224,828 are available from vendors such as DCG Systems and Hamamatsu. In some instances, TRE tools may be provided with two-dimensional imaging capabilities.

Figure 1:
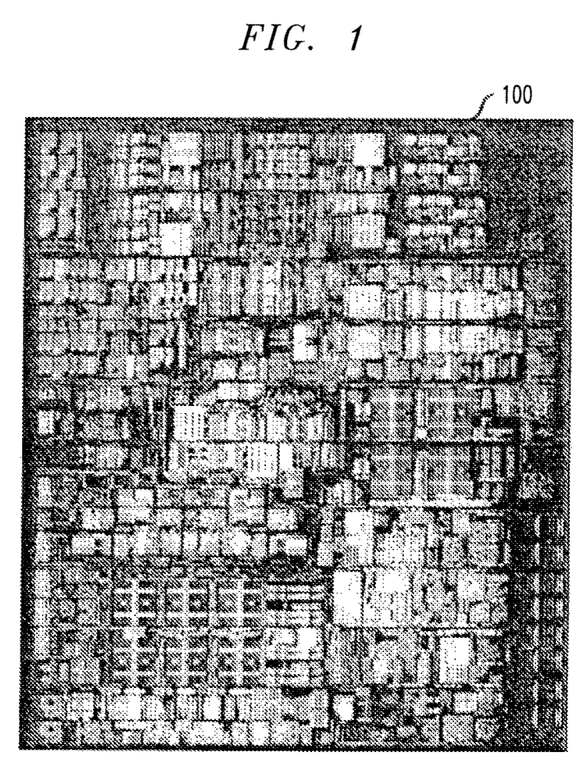
FIG. 1 presents a light emission image of an integrated circuit.
Figure 2A:
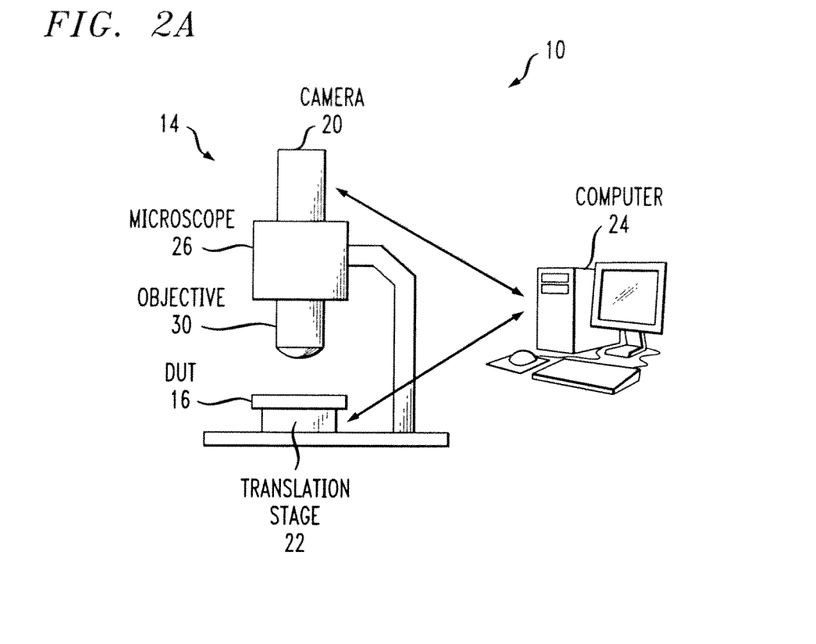
FIGS. 2A and 2B show exemplary diagnostic tool set-ups.
Figure 2B:
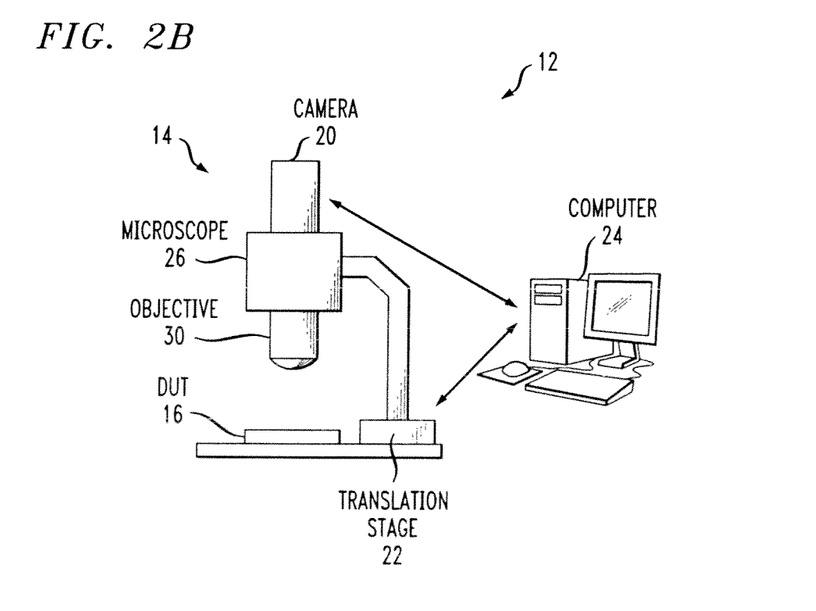

Purely by way of a non-limiting example, FIG. 1 shows an example 100 of a time integrated emission image acquired with a 10× lens from an integrated circuit. Furthermore, again, purely by way of a non-limiting example of an analytical tool, FIGS. 2A and 2B show two embodiments of systems 10, 12 for mapping integrated circuits from individual images. It is to be emphasized that these examples are non-limiting, and that one or more embodiments of the invention may be employed with a variety of different analytical tools besides those depicted in this specific example. Generally, each system includes an optical system 14 for collecting light from a device under test (DUT 16), an imaging detector 20 for measuring the light intensity, a translation stage 22 for moving either the DUT relative to the optical system or the optical system relative to the DUT, and a control unit 24 that controls this movement, the acquisition of the images, and the merging/stitching of the images into a single image with high resolution and large area coverage. The merging/stitching could also be done offline on a different computer in some embodiments.

In these embodiments, the optical system 14 includes a microscope 26 and an objective (or one or more lenses) 30 for collecting the light from the DUT 16. In order to allow for relative movement of the DUT compared to the optical system, either the DUT (as shown in FIG. 2A) or the optical system (as shown in FIG. 2B) is mounted on the translation stage 22. The stage is connected to the control unit 24, which may, for example, be a personal computer that is used to move the stage to the desired positions necessary for the acquisition.

A camera 20 is mounted on the microscope 26 and the collected light is focused on such detector for being acquired. The detector could be of different types such as back-illuminated or intensified Charge-Coupled Devices (CCDs), InGaAs cameras, MgCdTe (MCT) cameras, Photo-Multiplier Tubes (PMTs), as well as additional types of new cameras and materials that are sensitive at the near-infrared region of the spectrum. Different types of cameras may be chosen depending on their spectral response, noise, sensitivity, number of pixels and pixels size. The camera 20 is controlled by the computer 24 that permits starting/stopping an acquisition, retrieving the image from the camera and storing it in memory or on a disk for further analysis.

As discussed above in the background section, there are a number of different layout software packages. One or more embodiments of the invention advantageously allow automatically moving and/or driving these test and diagnostics tools from the layout environment, advantageously dramatically reducing the turn around time of tool operation. Furthermore, one or more embodiments are not particularly limited with respect to the number of tools that they can drive and/or the number of layout formats that they can import. Even further, one or more embodiments do not require importing a layout file that is parsed and transformed into a particular internal format before the analytical tools can be operated, allowing for faster operation than if such were the case. Even further, one or more embodiments are easy to set up, use, and maintain.

One or more embodiments of the invention provide a method and system for driving analytical tools from the chip layout, without the need to access software application program interfaces (API) from either the layout software or the tool software. Furthermore, one or more embodiments can readily handle coordinate transformations and/or do not require that the tool control software and the layout display software be run from the same platform.

One or more embodiments of the invention make use of a cross-mapped layout browser, allowing the user to load layout design data and layout versus schematic cross-reference tables. Such a program preferably allows the user to view the geometry of the design, and correlates shapes to logic design entities, and also allows search for entities like cells, instances, and nets. Further details are provided below, it being understood that the same are exemplary in nature and that, given the teachings herein, the skilled artisan will be able to adapt a wide variety of layout and tool control software programs to implement one or more embodiments of the invention.

One or more embodiments of the invention make use of a scripting language called "AutoIt." In particular, AutoIt v3 is a freeware BASIC-like scripting language designed for automating the Windows graphical user interface (GUI) and general scripting. It uses a combination of simulated keystrokes, mouse movement and window/control manipulation in order to automate tasks. The AutoIt software was authored by Jonathan Bennett. Given the teachings herein, the skilled artisan will be able to use AutoIt software or similar scripting software to implement one or more embodiments of the invention.

It is to be emphasized that the use of "AutoIt" software is optional and many other software languages may be used to implement one or more embodiments of the invention from more traditional Basic, C/C++, and so on to more modern scripting languages such s Perl, Tcl/Tkl, Ruby, and so on. Additionally, a commercial equivalent of the "AutoIt" software is WinBatch® software available from Wilson WindowWare of Seattle. Wash., USA.

Figure 3:
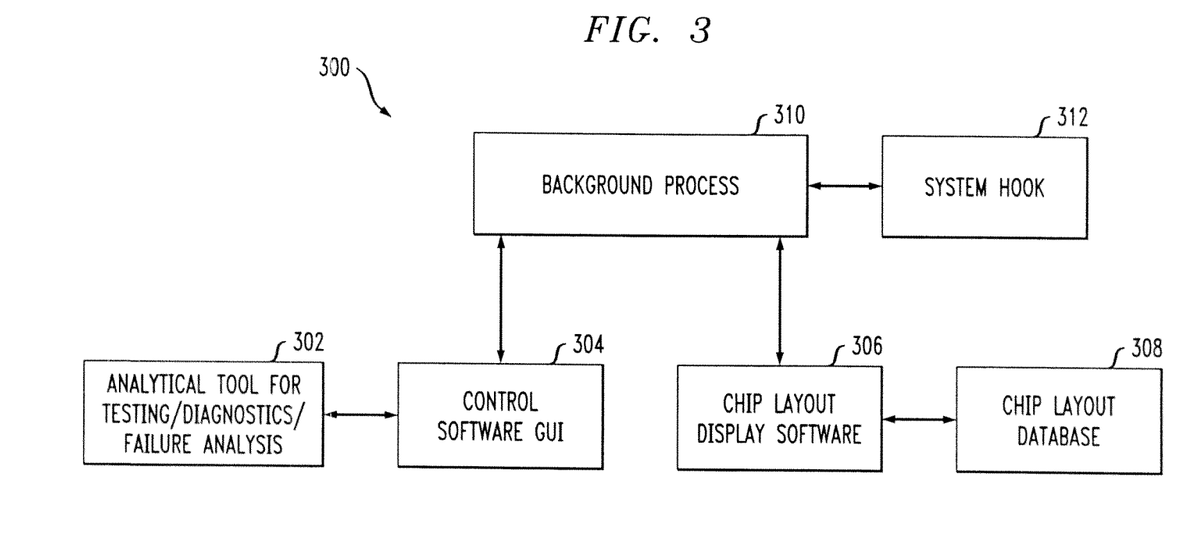
FIG. 3 shows an exemplary system block diagram, according to an aspect of the invention.

Attention should now be given to system block diagram 300 of FIG. 3. Note that "GUI" refers to a graphical user interface; "FA" refers to failure analysis, and "SW" refers to software. In one or more embodiments, a system is provided for moving and/or driving an analytical tool 302 from chip layout software 306. The system 300 includes analytical tool 302 (non-limiting examples shown in FIGS. 2A and 2B) and its proprietary software 304 (which could run, for example, on computer 24 as seen in FIGS. 2A and 2B) for controlling the tool; layout display software 306 capable of showing the chip layout from database 308 and allowing the user to navigate such layout; and software running in the background (background process 310). In the case in which the layout drives the analytical tool, background process 310 has installed a system message hook 312 into the operating system (of the machine on which analytical tool 302 is running) or the chip layout display software program 306. In the opposite case where a certain coordinate displayed in the analytical tool has to be found in the layout, then the hook should be either on the operating system (OS) of element 304 or in element 304 itself. Note also that if elements 304 and 306 are on the same PC, then process 310 is unique, whereas if elements 304 and 306 are on different PCs then process 310 may need to run on both or to be broken in two parts or have a master-servant mode on both computers. However it remains that the "hook" needs to be installed only on the side where the communication is initiated as described above.

Figure 7:
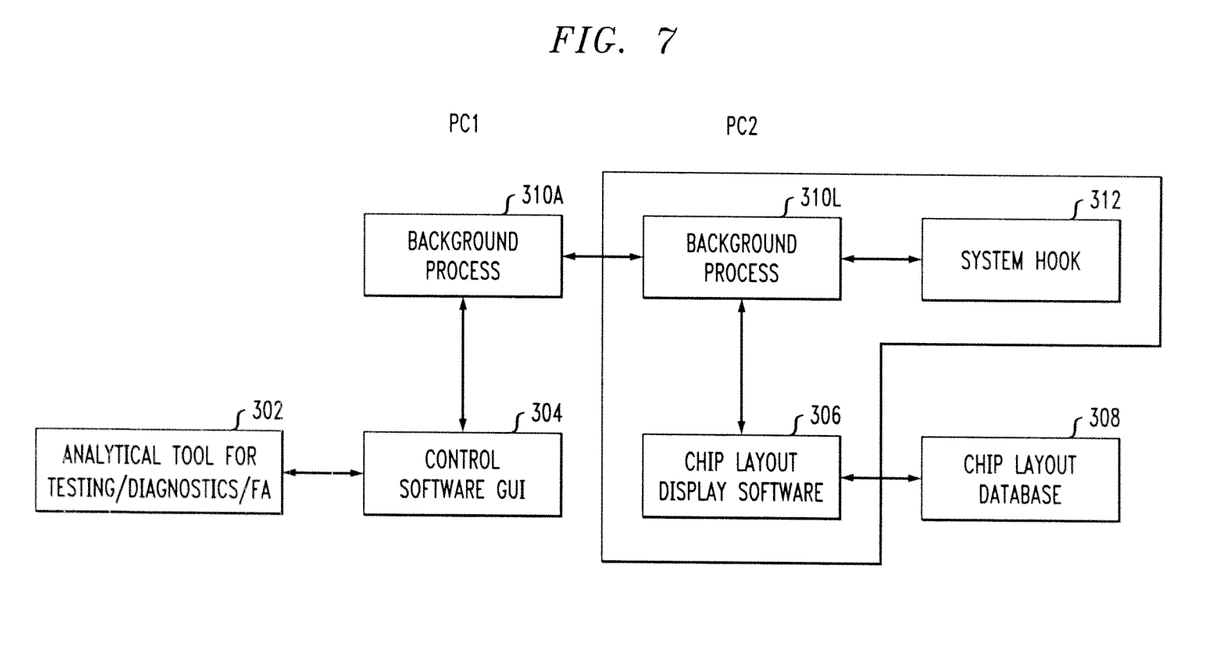
FIG. 7 shows an exemplary system block diagram similar to that in FIG. 3 wherein different components execute on different computers, according to yet another aspect of the invention.

Hook 312 is employed for intercepting system messages (and/or window messages, and/or communication messages between windows, users, and/or operating systems(s) in any combination) such as pressed keys and mouse clicks. Process 310 can read the content of the layout software window 306 to retrieve coordinates and the like. Furthermore, process 310 can interact with and/or control the analytical tool 302 in ways similar to the user, for example, by typing in coordinates, and pressing buttons in the GUI. It will therefore be understood that there may be a need of running the same element 310 on two (or more) PCs or operating systems if elements 304 and 306 are separated. The same element 310 may recognize by itself (or use settings) to let it know that is with element 304 or 306 and implement the appropriate piece of the process described above. Alternatively, referring to FIG. 7, two different versions of element 310 may be created in which only certain components are implemented: for example 310L handles only layout communication and goes with element 306, while 310A handle analytical tools and goes with element 304. It should be noted that, in either case above, where elements 304 and 306 are not on the same PC and/or OS and two pieces of element 310 are running, there should be some form of communication between the two pieces such as TCP/IP or other (local network, internet, and so on). In some cases, such as the "inverse" case discussed elsewhere herein, a system hook can be provided on the machine PC1.

Element 312 may or may not be part of element 310; where it is part, it may be realized, for example, as a separate thread or process. A function of element 312 is to monitor system messages, window messages, and so on, possibly doing some checking (for example, if "ESC" is pressed in a word processing program such as Microsoft WORD, do nothing, if "ESC" is pressed in the layout software, then do something) and request an action by element 310.

In a non-limiting exemplary embodiment, the software 310 running in the background is developed using the aforementioned AutoIt scripting language. Furthermore, purely for the purposes of a non-limiting example, consider a case where the display software 306 is a cross-mapped layout browser, allowing the user to load layout design data and layout versus schematic cross-reference tables, and which allows the user to view the geometry of the design, correlates shapes to logic design entities, and allows search for entities like cells, instances, and nets; and where the DCG Systems Emiscope® III TRE tool is an example of tool 302.

In particular the background process 310, upon startup, creates system hook 312 to intercept a certain key-press or sequence of key-presses using the command:
HotKeySet(<hotkey>, <function>)

Here, the <hotkey> placeholder indicates the key that needs to be intercepted, for example "ESC" or any other key, and the <function> placeholder represent the function internal to the background software 310 that will be called when the specified key is pressed. For example a HotKeySet(" [ESC]", DoAction) means that when the "ESC" key is pressed, the DoAction function will be executed. In certain embodiments, the hook (or the called DoAction function) may incorporate additional criteria for deciding upon executing the next actions. In particular, it may check if the layout software window 304 has the current focus (only if the ESC key is pressed while the 304 has focus then it will go through) and/or if the mouse is over the 304 window (inside the perimeter of the window or above a certain control of interest).

Additionally the software 310 can read the present layout coordinates from the layout display program 306 using the following commands:
$x=ControlGetText(<windowID>, <windowtext>, <controlID_x>)
$y=ControlGetText(<windowID>, <windowtext>, <controlID_y>)

In particular, these functions allow retrieval of the content of GUI controls <controlID_x> and <controlID_y>, which display the current layout coordinates inside the layout display window 306, which can be identified by means of <windowID> and <windowtext>. The parameters $x and $y are variables that will contain the (x,y) coordinates returned by the function calls. In the practical case of the Chip View program, the above commands become:
$x=ControlGetText("IBM ChipView", "Settings", "SunAwtLabel3")
$y=ControlGetText("IBM ChipView", "Settings", "SunAwtLabel4")

Note that the above expressions may be modified in many ways while still obtaining the same result. In particular, the current coordinates may not be displayed by the layout window and more complicated steps to retrieve them may be necessary, including exchanging communications with element 304 in the form of TCP commands (or others).

Finally, the background program 310 can interact with the analytical tool software GUI 304 by entering navigation coordinates and executing commands leading to the tool movement (e.g., translation of the stages 22 in FIGS. 2A and 2B), such as pressing buttons and the like.
ControlSetText(<windowID>, <windowtext>, <controlID_x>, $x)
ControlSetText(<windowID>, <windowtext>, <controlID_y>, $y)
ControlClick(<windowID>, <windowtext>, <controlID_move>)

Again, <windowID> and <windowtext> are used to uniquely identify the GUI software 304 of the analytical tool 302. The ControlSetText statements are used to write the content of the $x and $y variables into the GUI controls <controlID_x> and <controlID_y>; this is a result similar to what the user could have achieved by typing the values manually into the specified controls. Finally, a ControlClick statement simulates a mouse click on the <controlID_move> button, which triggers the tool movement to the coordinates previously specified.

In an alternative, sequences of keys may be used to either enter the coordinates and/or trigger the movement; for example, using "shortcut keys" made available to the user by the tool. The following command may be used to trigger the shortcut "Ctrl+M" that causes the stage to move:
Send(<windowID>, <windowtext>, "^M")

Here, <windowID> and <windowtext> are used to uniquely identify the GUI software 304 as before and "^M" introduces the character "M" (with a "control" key pressed) into the messaging processing queue of 306.

In even another alternative method, menu entries of the analytical tool control software may be used to set the coordinates and move the stage. For example the Auto It function below could be executed by element 310:
WinMenuSelectItem (<windowID>, <windowtext>, "item1" [, "item2" [, "item3" [, "item4" [, "item5" [, "item6" [, "item7"]]]]]])

Here, <windowID> and <windowtext> are used to uniquely identify the GUI software 304 as before and "item?" are menu entries. Considering the specific case in which the GUI 304 has a top menu entry "Stage" with a submenu entry "Move" to trigger a movement, the above command would become:
WinMenuSelectItem(<windowID>, <windowtext>, "Stage", "Move")

Figure 4:
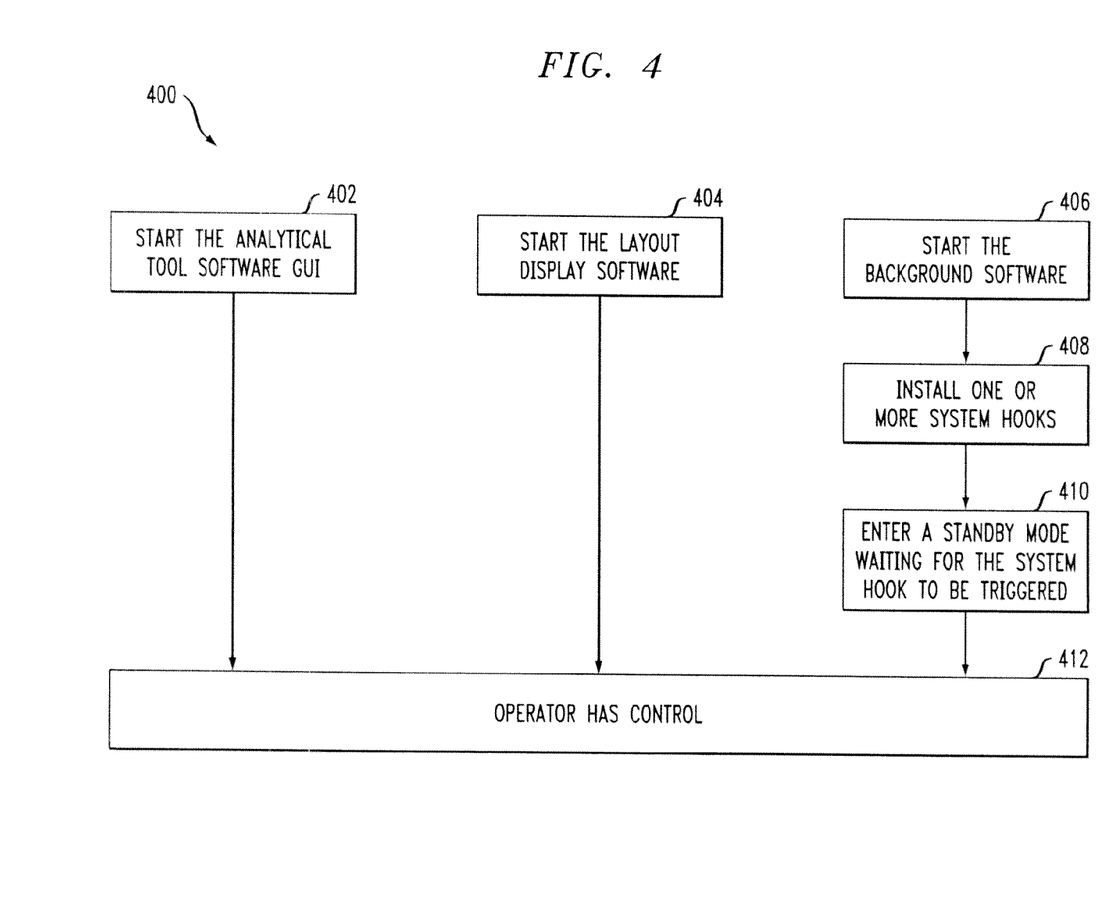
FIG. 4 shows a flow chart of an exemplary method for moving and/or driving an analytical tool from chip layout software, according to another aspect of the invention.

Attention should now be given to flow chart 400 of FIG. 4, which depicts an exemplary embodiment of a method, according to an aspect of the invention, for moving and/or driving an analytical tool 302 from chip layout software 306. In an initialization procedure, the analytical tool software GUI 304 is started, as in step 402; the chip layout display software 306 is started, as in step 404; the background software 310 is started as in step 406; and software 310 installs one or more system hooks 312 for intercepting certain system messages, as in step 408. In step 410, the background program(s) (i.e., program(s) 310) enter a sleep and/or waiting mode until the system hook 312 is activated by the predefined key combination; during this time period, the operator has control of the system, as in step 412. Note that the order of starting 402 vs. 404 typically does not matter; on the other side, it may or may not matter if element 406 is started before or after 402 and/or 404. In certain cases step 408 may require that the process 402 and/or 404 are running already to install the hook, additionally 406 may have a check to verify communication with 402 and/or 404 in its initialization. It is preferred that element 306 is running before the 312 hook code is executed.

Figure 5:
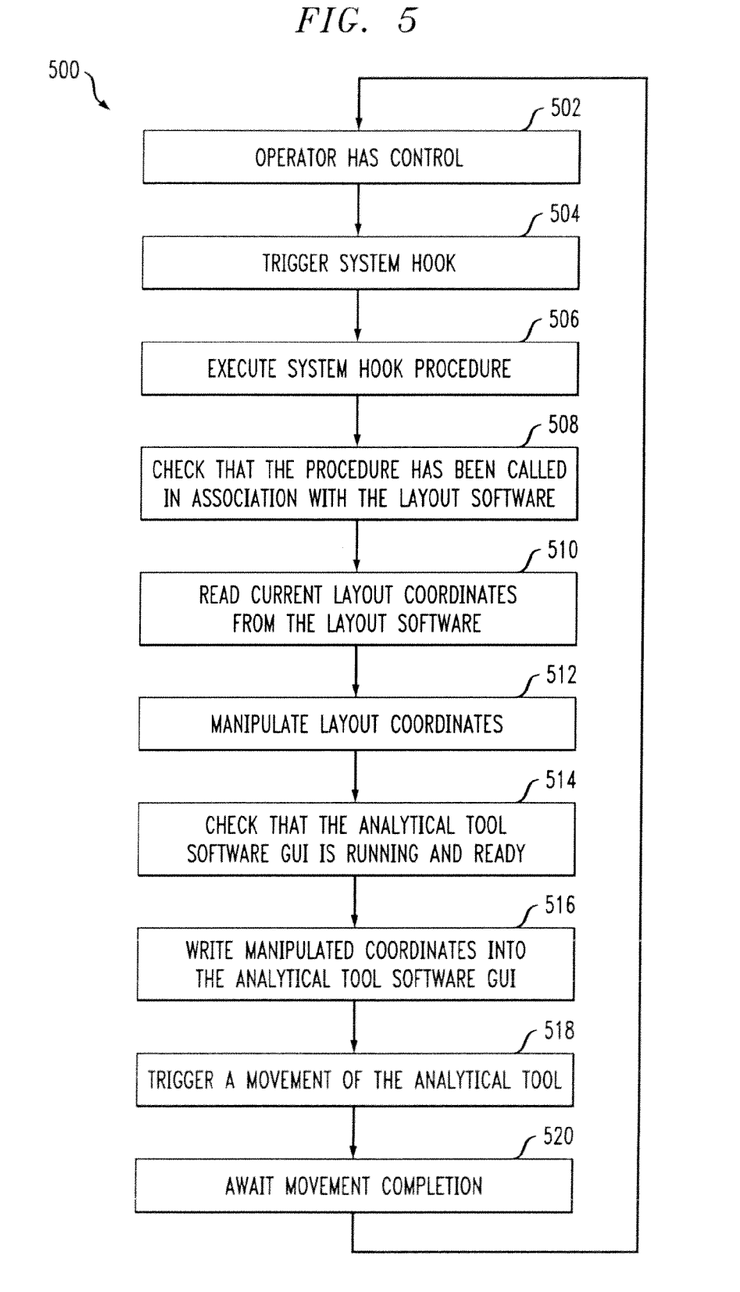
FIG. 5 shows a flow chart of an exemplary background process, according to still another aspect of the invention.

Flow chart 500 of FIG. 5 depicts exemplary actions instituted by process 310 once the hook procedure 312 is called. Step 502 depicts the initial condition (as in step 412 of FIG. 4) wherein the operator has control of the system. Step 504 shows triggering of the system hook and step 506 shows execution of the system hook procedure. In step 508, make sure that the system hook call was associated to the layout display software 306 (for example by making sure that such software is running, its main window is visible, the mouse is in such window, and so on). In step 510, retrieve the current layout coordinates by reading the content of certain controls in the software window. In step 512, manipulate, transform, translate, rotate, and/or scale, and so on, the retrieved coordinates appropriately, no as to make them compatible with the coordinates of analytical tool system 302. In step 514, make sure that the analytical tool software GUI 304 is running and in the proper state to receive the coordinates. In step 516, enter the new navigation coordinates in the appropriate controls of the GUI 304. In step 518, trigger a tool movement by pressing certain buttons or interacting with the window menu, and so on. In optional step 520, wait for the completion of the movement operation. As indicated by the return arrow to block 502, return into the sleep and/or wait mode, ready for a new request through a system hook call.

Note that the opposite approach is also possible, i.e., the layout display software 306 may be updated depending on the location of the analytical tool 302. This approach may be particularly useful when the analytical tool is used to locate a failure and the corresponding layout information is needed. In this case the same system hook 312 or a different system hook can trigger a procedure where controls inside the analytical tool software GUI 304 are read to retrieve the coordinates. Then, the coordinates are manipulated and adapted to the layout display software 306. The procedure enters the content of the coordinates in certain controls of the layout software 306 and triggers an update. If the same system hook key 312 is used, then a function to identify the window that was associated to the key should be provided. If the window is the layout display software 306 then the method of FIGS. 4 and 5 is executed; otherwise, if the window associated with the system hook call is the analytical tool 302, then carry out the method as described in this paragraph.

It should also be noted that by separating the background software 310 in two entities, one associated to the layout display software and capable of handling the system hook calls and one associated with the analytical tool software GUI, the layout 306 and tool control software 304 do not necessarily need to be run from the same computer. The two parts of the background software run in the background on each of the two computers and exchange information via some type of connection; for example, a network connection, such one using TCP/IP (transfer control protocol/internet protocol) protocols or the like. In this case, security features may be desirable.

It should be noted that in testing memory arrays, the logic state mapping problem may arise. U.S. Pat. No. 6,721,935 discloses a coordinate transformation system. Coordinate transformation is made so that the FMB (fail bit map) physical address coincides with the defect data coordinate system. The logic memory address of a cell in the array often does not correspond to its physical location on the chip or layout of the chip. This is because memories are repetitive structures that are laid out automatically. Therefore, a tool that helps in identifying where in the physical layout a certain logic memory bit is located may be desirable. Techniques of U.S. Pat. No. 6,721,935 may in some instances be employed as a preliminary step before one or more embodiments of the invention are employed.

Furthermore, U.S. Pat. No. 7,320,115 discloses a method for identifying a physical failure location on an IC. An integrated circuit can be tested with one or more test patterns to identify a failure port. Hierarchical information of the failure port is generated through the test patterns. A physical location of the failure port in a layout of the integrated circuit is identified through a relation between the hierarchical information and a floor plan report. Layout information of a routing path associated with the physical location of the failure port is retrieved from a layout database. Thus, techniques of this reference allow for interpretation of the test pattern failures into possible defect locations on the chip and/or layout. Techniques of U.S. Pat. No. 7,320,115 may in some instances be employed as a preliminary step before one or more embodiments of the invention are employed. In one or more embodiments of the invention, the defect locations can be used to drive analytical tools.

Advantageously, one or more embodiments of the invention do not require the use of markings on the chip, and address the navigation of the physical chip with analytical tool 302 in the absence of navigation signs or marks.

U.S. Pat. No. 6,185,707 of Smith addresses interpretation of a fail condition observed on a tester into a schematic and/or layout call-out location. In one or more embodiments of the invention, the analytical tool is controlled to map those layout locations into physical measurements on the chip.

Given the discussion thus far, it will be appreciated that, in general terms, an exemplary method, according to one aspect of the invention, includes the optional step (e.g., 402, 404, 406) of initializing (i) tool control software 304 configured to control a physical tool 302 for analyzing integrated circuits, (ii) integrated circuit chip layout display software 306, and (iii) a background process 310. This step may be carried out by simply starting or re-starting each piece of software. An additional step 408 includes using the background process 310 to install at least one system hook for message interception of the integrated circuit chip layout display software. A further step (e.g., 504, 506) includes intercepting a call message through the system hook 302; while a still further step 510 includes, responsive to the call, reading current layout coordinates from the integrated circuit chip layout display software 306 (this step may be carried out by background process 310 in conjunction with software 306).

The system hook can be embodied in a system hook module (and in some instances, the system hook is a portion of the background process and the system hook module is a portion of the background process module). The system hook intercepts a system message caused by the user doing something such as pressing a key or clicking the mouse button. In at least some instances, the hook only intercepts, may do some checking, and then passes the execution to the background process that carries out the additional steps as discussed below. Again, in some cases hook 312 may be a subpart of process 310; for example a different thread of the same process or a second process of the same program. It is, however, preferable that they are able to run independently, since the activations are typically asynchronous and different: hook 312 is called by the system; process 310 is called by hook 312. Note that the recitation herein, including the claims, of a system hook module is intended, unless explicitly stated otherwise, to encompass both a separate system hook module and one embodied within a background process module.

Yet further steps include entering a representation of the current layout coordinates into the tool control software, as at 516 (this step may be carried out by background process 310 in conjunction with software 304), and controlling the physical tool for analyzing integrated circuits with the tool control software, based on the representation of the current layout coordinates, as at 518. As used herein, a representation of the current layout coordinates includes the actual "raw" coordinates or such coordinates after they have been changed, as discussed elsewhere herein, to be compatible with the tool control software.

Thus, an optional additional step 512 includes rendering the current layout coordinates compatible with the tool control software to obtain the representation of the current layout coordinates (this step may be carried out by background process 310).

Another optional step 514 includes verifying that the tool control software is running and in an appropriate state to receive the representation of the current layout coordinates, prior to entering the representation of the current layout coordinates into the tool control software (this step may be carried out by background process 310 in conjunction with software 304).

A still further optional step 508 includes verifying that the call to the system hook is associated to the integrated circuit chip layout display software (this step may be carried out by background process 310 and/or system hook 312 in conjunction with software 306).

Furthermore, given the discussion thus far, it will be appreciated that, in general terms, another exemplary method ("inverse"), according to another aspect of the invention, includes the optional step (e.g., 402, 404, 406) of initializing (i) tool control software 304 configured to control a physical tool 302 for analyzing integrated circuits, (ii) integrated circuit chip layout display software 306, and (iii) a background process 310. This step may be carried out by simply starting or re-starting each piece of software. Another step includes using the background process 310 to install at least one system hook for message interception of the analytical tool control software GUI 304. With reference now to flow chart 800 of FIG. 8, which begins in astute 802 analogous to state 502, a further step 804, 806 includes intercepting a call message through the system hook. A still further step 810 includes, responsive to the call message, reading current coordinates from the analytical tool control software (using, for example, background process 310 and tool control software 304). Still further steps 816 and 818, respectively, include entering a representation of the current coordinates into the integrated circuit chip layout display software (using, for example, background process 310 and integrated circuit chip layout display software 306); and displaying at least a portion of an integrated circuit layout corresponding to the representation of the current coordinates from the tool control software (using integrated circuit chip layout display software 306).

Figure 8:
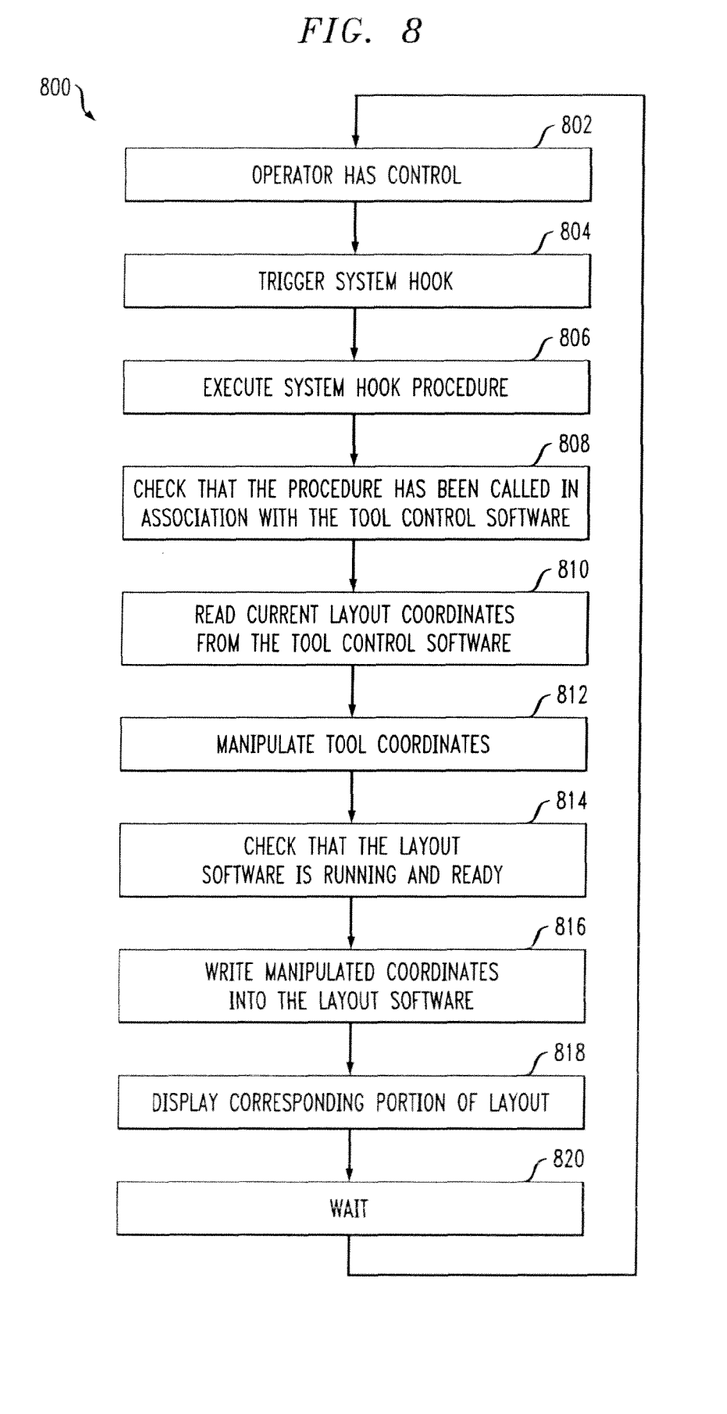
FIG. 8 shows a flow chart of an exemplary "inverse" background process, according to a further aspect of the invention.

One optional additional step 812 includes rendering the current coordinates from the analytical tool control software compatible with the integrated circuit chip layout display software to obtain the representation of the current coordinates (using, for example, background process 310).

Another optional additional step 814 includes verifying that the integrated circuit chip layout display software is running and in an appropriate state to receive the representation of the current coordinates, prior to entering the representation of the current coordinates into the integrated circuit chip layout display software (using, for example, background process 310 and integrated circuit chip layout display software 306).

Still another optional additional step 808 includes verifying that the call to the system hook is associated to the tool control software (using, for example, background process 310 and tool control software 304).

In optional step 820 with return arrow to block 802, return into the sleep and/or wait mode, ready for a new request through a system hook call.

In another aspect, one or more embodiments of the invention may be realized as a system including one or more of the blocks shown in the block diagrams, realized as one or more hardware modules and/or one or more software modules executing on one or more hardware processors.

Tool Control Software Configured to Control a Physical Tool for Analyzing Integrated Circuits Non-limiting examples of the physical tools include analysis tools, inspection tools, and failure analysis tools. Such tools may include, by way of example and not limitation, time-resolved emissions, static emission, laser-based inspection tools, and so on. In general, in such tools, there is a location for plugging in or otherwise mounting an integrated circuit chip, wafer, module, or other similar device under test. Such tools are typically so complex that they cannot be manually operated; e.g., the lens or stage cannot be manipulated by hand and must be motorized or otherwise automated with a suitable actuator or the like. Software running on a personal computer, workstation, or other computer system is attached to the physical tool via one or more cables, or another form of connection. The software controls the motor(s) and/or other actuator(s), undertakes appropriate compensation if needed, and so on, to enable the user to carry out operations such as the manipulation of a stage or lens to a desired spot on a chip, which could not appropriately be carried out by hand. Thus, the control software provides an interface between the user and the physical tool itself, because the tool is typically too complex and delicate to be manually operated. Typically, there is a display which allows viewing an image of some kind from the chip; there may be options to move the stage and/or the lenses; there may be other sensors or detectors requiring control, and so on. As used herein, including the claims, a "physical tool for analyzing integrated circuits" includes (i) any physical tool capable of plugging in or otherwise mounting an integrated circuit chip, wafer, module, or other similar device under test and carrying out analysis, inspection, or failure analysis of same, as well as, but not limited to, (ii) any specific examples of such tools provided herein. As used herein, including the claims, "tool control software configured to control" such a "physical tool for analyzing integrated circuits" includes software or firmware executable on one or more hardware processors to control such a physical tool; by way of example and not limitation, by controlling translation and/or rotation of a stage, a lens, and/or another sensing element.

Integrated Circuit Chip Layout Display Software

When designing and fabricating an integrated circuit chip, a plurality of masks are typically employed, and various layers need to be precisely positioned on the chip. A "layout" including many layers of shapes is typically used to construct a chip. These shapes indicate how the chip is to be constructed, and provide a representation of the final, physical chip. The user needs to be able to view, navigate, inspect, and so on, the computer files including the layers of shapes; this is typically carried out with a chip layout browser. There is typically a database of shapes describing the chip, and the browser can read, interpret, and display same. The browser may also be able to enable or disable certain layers for display, display in different colors, display or not display certain features, and so on. The browser may reside on a user's computer or may be made available over a network, for example. It may be written in JAVA, C, or other languages. As used herein, including the claims, "integrated circuit chip layout display software" is intended to encompass browser software adapted to allow a user to view the layers of shapes in a database which describe an integrated circuit ship or related structure such as a wafer or module. Some layout software also includes a tool used to construct the layout itself. As used herein, including the claims, "integrated circuit chip layout display software" may or may not have such capability of actually constructing the layout itself.

A non-limiting example will now be provided. It is to be emphasized that the characteristics described in this text are entirely exemplary, and software 306 may or may not have one or more of these characteristics. In some instances, software 306 may include a cross-mapped layout browser suitable for very large scale integration (VLSI) diagnostics activities in a semiconductor manufacturing environment. Semiconductor devices are designed using heterogeneous electronic design automation (EDA) tools, and their manufacturing process includes many complex steps. The yield learning process, a significant aspect of profitability and customer satisfaction, typically requires the ability to easily browse the mask data and to correlate physical features, e.g., a shape at metal level M1, to design schematic features, e.g., nets, instances, and cells.

Many layout browsers are available in industry; the same may rely on in-core data structures requiring significant loading time and memory requirements.

The following summarizes exemplary features and functionalities that may be present, in some cases, in software 306.

Deployment: the application is deployed as stand-alone and in a web environment where users launch the application using pointers on web pages.

Authentication: the application provides a flexible authentication scheme; the system administrator can authorize each user to open a selected subset of designs.

Cell browsing: the user can open and browse multiple design cells at the same time without restriction on the number of simultaneous open instances of a specific cell.

Display Control: design shapes can be displayed as is, or rotated and/or mirrored according to user selection. The user has the choice of what design levels to display and in which order. Along with the normal design levels, an additional level representing the boundaries of cell instances can be provided. Moreover, for hierarchical designs, the user can specify what hierarchy depth range to display. For example, it is possible to display only the shapes of the prime cell or the shapes in instances two-level deep in the hierarchy. As it is difficult to read rotated and/or mirrored design text annotations, the user can instruct the browser to display them always straight along with a mark designating the text origin. The browser displays a thumbnail containing a rough hierarchical view of full chip in which the current view port is outlined. Besides the usual browsing functions like zooming and panning, clicking on the thumbnail causes the browser view port to pan to the corresponding location. A history navigator allows the user to play back and forth his or her previous view ports. To prevent lengthy redraws, the user has the option to specify the minimum shape size, maximum number of shapes that the browser should display. Color and style of levels (pattern fill, transparency) is user definable.

Schematic entities lookup and display: tracing physical shapes corresponding to schematic entities, e.g. nets, instances, or cells, does fuzzy string matching in order to resolve possible design methodology discrepancies that often result in differences between the design and test/diagnostics net lists. The layout browser highlights the traced shapes on top of the layout shapes on the levels of user choice. Nets and/or instances of user interest are kept in a list from which the user selects the subset to be highlighted. For a specific net, the user has the possibility to query for its physically adjacent nets as well as its geometrical properties like width, length, and area on each design level. The browser is also capable of tracing nets by following the physical connectivity starting at a specific location (X/Y, level).

Dynamic Layout to Schematic Correlation: when the graphical user interface pointer hovers over a shape, the shape gets highlighted, and its physical and logical attributes (shape type, design level, net name, instance name, cell name) get displayed.

User Annotation: the browser offers graphics and text editing functionalities that allow the user to draw graphics documents overlaid on top of the chip layout; documents that can be saved and communicated to other users.

Remote View Synchronization: multiple users browsing the same chip layout can establish a synchronization session that makes the browsing activities of a user affect all the other synchronized sessions so that all users see the same view port.

Alternate Coordinate System: the browser provides the ability to create a coordinate system aligned to a physical inspection tool, e.g., scanning electron microscope, by means of three alignment points. The alternate coordinate system is basically a linear transformation of the design coordinate system. The outcome is that, panning both the browser and the inspection tool to the same X/Y coordinates makes both of them go to the same location regardless of how the inspected chip is rotated. The coordinate system of the inspection tool should preferably be linear.

Dynamic Virtual Level Creation: the browser provides the functionality of creating new levels that represent expressions of existing or newly created levels. Examples of expression operators are: Boolean geometrical functions (intersection, union, and inversion), expansion, shrink, linear transformation.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 6:
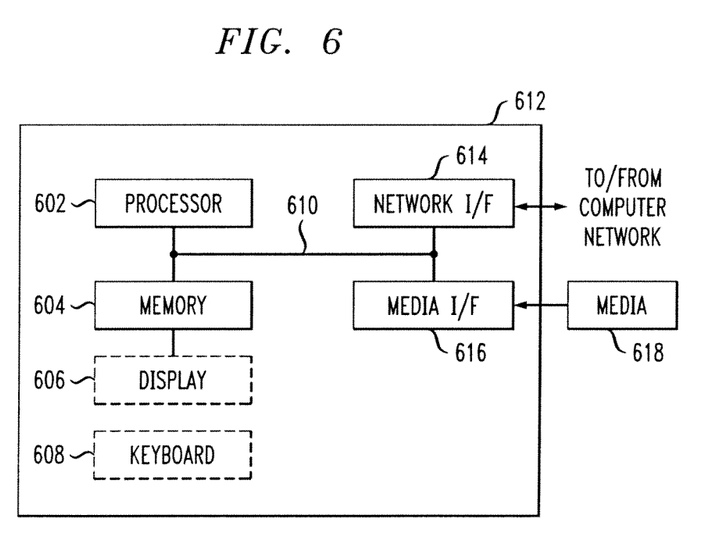
FIG. 6 depicts a computer system that may be useful in implementing one or more aspects and/or elements of the invention.

One or more embodiments can make use of software running on a general purpose computer or workstation. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

System 612 represents, for example, one possible configuration of computer 24. In some instances, all software components could run on a single system. In other instances, control software 304 might run on computer 24, for example, and another computer (for example, generally similar to system 612 and connected thereto via a network using interface 614) might run software 306.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 618 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. As noted, the AutoIt scripting language or a similar scripting language may be employed in at least some instances. Indeed, as noted, it is to be emphasized that the use of "AutoIt" software is optional and many other software languages may be used to implement one or more embodiments of the invention from more traditional Basic, C/C++, and so on to more modem scripting languages such s Perl, Tcl/Tkl, Ruby, and so on. Additionally, a commercial equivalent of the "AutoIt" software is Win-Batcht® software available from Wilson WindowWare of Seattle, Wash., USA. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium (or multiple such media); the modules can include, for example, any or all of the elements depicted in the block diagrams and/or described herein; by way of example and not limitation, a tool control module, a chip layout display module, and a background process module. The chip layout display module may interface with a chip layout database. The background process module may install one or more hooks 312. The method steps can then be carried out using the distinct software modules and/or sub-modules of the system, as described above, executing on one or more hardware processors 602. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising the steps of:
using a background process to install at least one system hook for message interception of tool control software configured to control a physical tool for analyzing integrated circuits;
intercepting a call message through said system hook;
responsive to said call message, reading current coordinates from said tool control software;
entering a representation of said current coordinates into integrated circuit chip layout display software; and
displaying at least a portion of an integrated circuit layout corresponding to said representation of said current coordinates from said tool control software.

2. The method of claim 1, further comprising the additional step of rendering said current coordinates from said tool control software compatible with said integrated circuit chip layout display software to obtain said representation of said current coordinates.

3. The method of claim 1, further comprising the additional step of verifying that said integrated circuit chip layout display software is running and in an appropriate state to receive said representation of said current coordinates, prior to entering said representation of said current coordinates into said integrated circuit chip layout display software.

4. The method of claim 1, further comprising the additional step of verifying that said call message intercepted through said system hook is associated to said tool control software.

5. The method of claim 1, further comprising providing a system, wherein the system comprises distinct software modules, each of the distinct software modules being embodied on a computer-readable storage medium, and wherein the distinct software modules comprise a tool control module, a chip layout display module, a background process module, and a system hook module; wherein:
said installing of said at least one system hook is carried out by said background process module executing on at least one hardware processor;
said intercepting said call message through said system hook is carried out by said system hook module executing on said at least one hardware processor;
said reading of said current coordinates from said tool control software is carried out by said background process module and said tool control module executing on said at least one hardware processor;
said entering of said representation of said current coordinates into integrated circuit chip layout display software is carried out by said background process module and said chip layout display module executing on said at least one hardware processor; and
said displaying at least said portion of said integrated circuit layout is carried out by said chip layout display module executing on said at least one hardware processor.

6. The method of claim 1, further comprising providing a system, wherein the system comprises distinct software modules, each of the distinct software modules being embodied on a computer-readable storage medium, and wherein the distinct software modules comprise a tool control module, a chip layout display module, a background process module, and a system hook module; wherein:
said installing of said at least one system hook is carried out by said background process module executing on at least a first hardware processor;
said intercepting said call message through said system hook is carried out by said system hook module executing on said at least first hardware processor;
said reading of said current coordinates from said tool control software is carried out by said background process module and said tool control module executing on said at least first hardware processor;
said entering of said representation of said current coordinates into integrated circuit chip layout display software is carried out by said background process module and said chip layout display module executing on at least a second hardware processor; and
said displaying at least said portion of said integrated circuit layout is carried out by said chip layout display module executing on said at least second hardware processor.

7. A computer program product comprising a non-transitory computer readable storage medium having computer readable program code embodied therewith, the computer readable program code comprising:
computer readable program code configured to use a background process to install at least one system hook for message interception of tool control software configured to control a physical tool for analyzing integrated circuits;
computer readable program code configured to intercept a call message through said system hook;
computer readable program code configured to, responsive to said call message, read current coordinates from said tool control software;
computer readable program code configured to enter a representation of said current coordinates into integrated circuit chip layout display software; and
computer readable program code configured to display at least a portion of an integrated circuit layout corresponding to said representation of said current coordinates from said tool control software.

8. The computer program product of claim 7, further comprising computer readable program code configured to render said current coordinates from said tool control software compatible with said integrated circuit chip layout display software to obtain said representation of said current coordinates.

9. The computer program product of claim 7, further comprising computer readable program code configured to verify that said integrated circuit chip layout display software is running and in an appropriate state to receive said representation of said current coordinates, prior to entering said representation of said current coordinates into said integrated circuit chip layout display software.

10. The computer program product of claim 7, further comprising computer readable program code configured to verify that said call message intercepted through said system hook is associated to said tool control software.

11. The computer program product of claim 7, wherein:
said computer readable program code configured to use said background process executes on at least a first hardware processor;
said computer readable program code configured to intercept said call message executes on said at least first hardware processor;

said computer readable program code configured to, responsive to said call message, read said current coordinates, executes on said at least first hardware processor;

said computer readable program code configured to enter said representation of said current coordinates executes on at least a second hardware processor; and said computer readable program code configured to facilitate displaying executes on said at least second hardware processor.

* * * * *